United States Patent [19]
Yoshida

[11] Patent Number: 5,885,863
[45] Date of Patent: Mar. 23, 1999

[54] METHOD OF MAKING A CONTACT FOR CONTACTING AN IMPURITY REGION FORMED IN A SEMICONDUCTOR SUBSTRATE

[75] Inventor: Seiko Yoshida, Tokyo, Japan

[73] Assignee: Kabushiki Kaisha Toshiba, Japan

[21] Appl. No.: 828,588

[22] Filed: Mar. 31, 1997

[51] Int. Cl.⁶ .............................................. H01L 21/8242
[52] U.S. Cl. ..................... 438/239; 438/242; 438/243; 438/246; 438/249; 438/386; 438/389; 438/392
[58] Field of Search ..................... 438/239, 240, 438/241, 242, 243, 244, 245, 246, 247, 248, 249, 386, 387, 388, 389, 390, 391, 392

[56] References Cited

U.S. PATENT DOCUMENTS

| | | |
|---|---|---|
| 4,116,720 | 9/1978 | Vinson ...................................... 148/1.5 |
| 4,658,283 | 4/1987 | Koyama . |
| 4,791,610 | 12/1988 | Takemae . |
| 4,801,989 | 1/1989 | Taguchi . |
| 4,829,017 | 5/1989 | Malhi ...................................... 438/243 |
| 4,845,537 | 7/1989 | Nishimura et al. . |
| 4,889,492 | 12/1989 | Barden et al. . |
| 4,918,502 | 4/1990 | Kaga et al. . |
| 4,999,783 | 3/1991 | Hsu . |
| 5,021,852 | 5/1991 | Sukegawa et al. . |
| 5,034,341 | 7/1991 | Itoh ........................................... 437/52 |
| 5,045,904 | 9/1991 | Kobayashi et al. . |
| 5,053,839 | 10/1991 | Esquivel et al. . |
| 5,079,615 | 1/1992 | Yamazaki et al. . |
| 5,185,284 | 2/1993 | Motonami . |
| 5,213,999 | 5/1993 | Sparks et al. ............................ 437/203 |
| 5,250,829 | 10/1993 | Bronner et al. . |
| 5,264,716 | 11/1993 | Kenney . |
| 5,336,912 | 8/1994 | Ohtsuki . |
| 5,343,354 | 8/1994 | Lee et al. . |
| 5,348,905 | 9/1994 | Kenney ..................................... 437/52 |
| 5,362,663 | 11/1994 | Bronner et al. . |
| 5,384,474 | 1/1995 | Park et al. . |
| 5,400,278 | 3/1995 | Kunori et al. . |
| 5,414,285 | 5/1995 | Nishihara . |
| 5,432,365 | 7/1995 | Chin et al. . |
| 5,521,115 | 5/1996 | Park et al. ................................ 437/60 |
| 5,665,622 | 9/1997 | Muller et al. ........................... 438/243 |

*Primary Examiner*—John F. Niebling
*Assistant Examiner*—Lynne A. Gurley
*Attorney, Agent, or Firm*—Banner & Witcoff, Ltd.

[57] ABSTRACT

A method for forming a contact is disclosed. A buried impurity region of a second conductivity type is formed in a semiconductor substrate of a first conductivity type. First and second well regions of a first and second conductivity types, respectively, are also formed in the semiconductor substrate. The second well region overlaps the first well region and contacts and surrounds the buried impurity region. A surface impurity concentration of the first well region is greater than a surface impurity concentration of the second well region. A contact to the second well region is formed.

8 Claims, 7 Drawing Sheets

METHOD OF MAKING A CONTACT FOR CONTACTING AN IMPURITY REGION FORMED IN A SEMICONDUCTOR SUBSTRATE

BACKGROUND OF THE INVENTION

1. Technical Field

The present invention relates to a contact for contacting an impurity region formed in a semiconductor substrate and to a method of forming the contact.

2. Description of Related Art

Recently, as the capacity of semiconductor memory devices such as DRAMs has increased, various arrangements have been proposed to increase the integration density of such memory devices. A one-transistor/one-capacitor memory cell is particularly well-suited for highly integrated memory devices since each memory cell is constituted by a small number of elements. Various types of one transistor/one capacitor DRAM cells are known, e.g., planar-type, stacked-type, and trench-type.

A trench-type memory cell is provided by forming a deep trench in a silicon substrate. A capacitor is then formed in the trench. Using such an arrangement, the cell area can be made smaller and the integration density can be greater as compared to a planar-type memory cell. In addition, discontinuities in wiring layers can result at step portions as the size of planar-type and stacked-type memory cells is decreased. In contrast, since the plate electrode of a trench-type capacitor is buried in the semiconductor substrate, the surface of the substrate is relatively planar and the wiring layers may be more accurately patterned. According to a conventional method of manufacturing a trench-type memory cell, an impurity such as arsenic or phosphorus is diffused from a bottom portion of the trench such that the diffusions from adjacent trenches are connected to form a buried plate electrode. The buried plate electrode functions as a wiring to which a potential may be applied. However, since this wiring layer is buried in the semiconductor substrate, it is difficult to apply a potential thereto.

One solution to the problem is to provide a "terminal trench" as described in U.S. Pat. No. 4,918,502. In this arrangement, the oxide film in one of the trenches is removed by photolithography and an N-type diffusion region is outdiffused from the side wall and bottom wall of this trench. This N-type diffusion region contacts the N-type diffusion regions outdiffused from the other trenches. A potential may then be applied to the wiring layer via the N-type diffusion region surrounding the terminal trench.

However, this and other arrangements for applying a potential to the buried plate generally require additional processing steps such as additional photolithography steps. This complicates overall fabrication process. Accordingly, there is a need for a contacting a buried plate or other deep diffusion region which does not require complex processing.

SUMMARY OF THE INVENTION

In accordance with one aspect of the present invention, a method for forming a contact is provided. A buried impurity region of a second conductivity type is formed in a semiconductor substrate of a first conductivity type. First and second well regions of a first and second conductivity types, respectively, are also formed in the semiconductor substrate. The second well region overlaps the first well region and contacts and surrounds the buried impurity region. A surface impurity concentration of the first well region is greater than a surface impurity concentration of the second well region. A contact to the second well region is formed. A contact formed using this method does not require extra masks and/or ion implanting steps and thus does not complicate the manufacturing process.

In accordance with another aspect of the present invention, a semiconductor device includes a semiconductor substrate of a first conductivity type and a buried impurity region of a second conductivity type formed beneath a surface of the semiconductor substrate. A first well region of the first conductivity type, having a first surface impurity concentration, is formed in the semiconductor substrate. A second well region of the second conductivity type is formed in the semiconductor substrate. The second well region overlaps the first well region and the second well region contacts and surrounds the buried impurity region. The second well region has a second surface impurity concentration which is less than the first surface impurity concentration, whereby the overlapping portion of the first and second wells is of the second conductivity type. A contact is formed to contact said second well region. In this way, a potental may be applied to the buried impurity region via the contact.

These and other features and advantages of the present invention will be better understood from a reading of the following detailed description in conjunction with the accompanying figures.

DETAILED DESCRIPTION

Figure 1A:
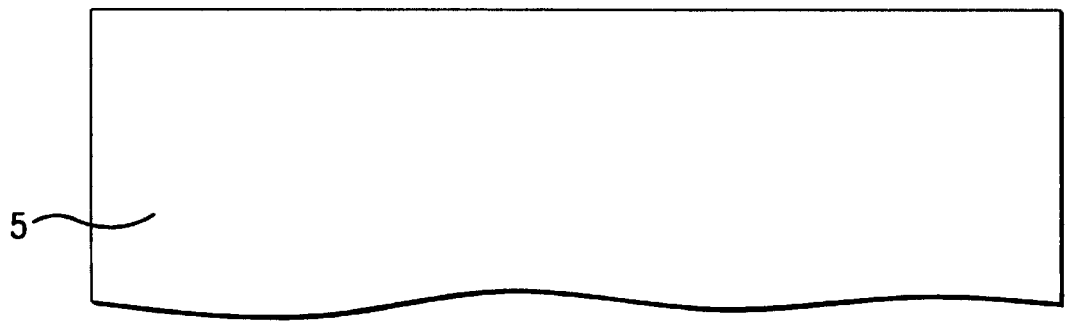
FIGS. 1(a)–1(j) illustrate a method in accordance with an embodiment of the present invention.
Figure 1B:
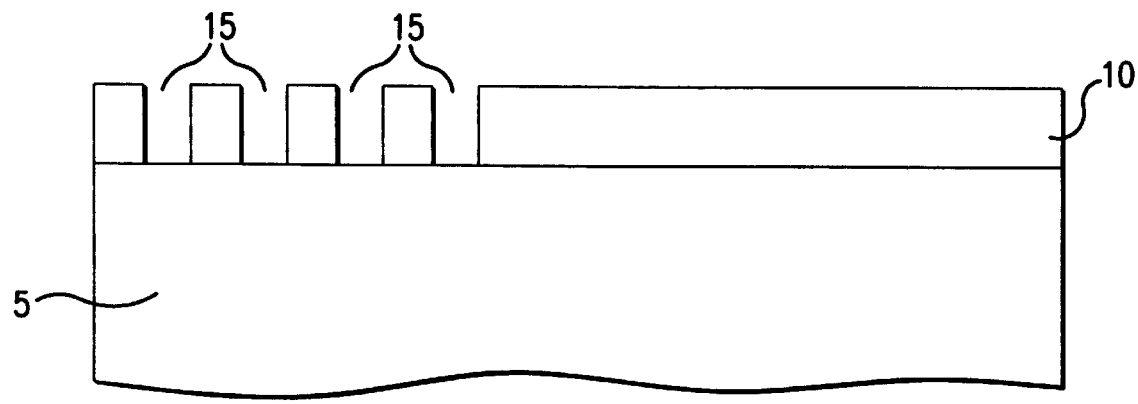
Figure 1C:
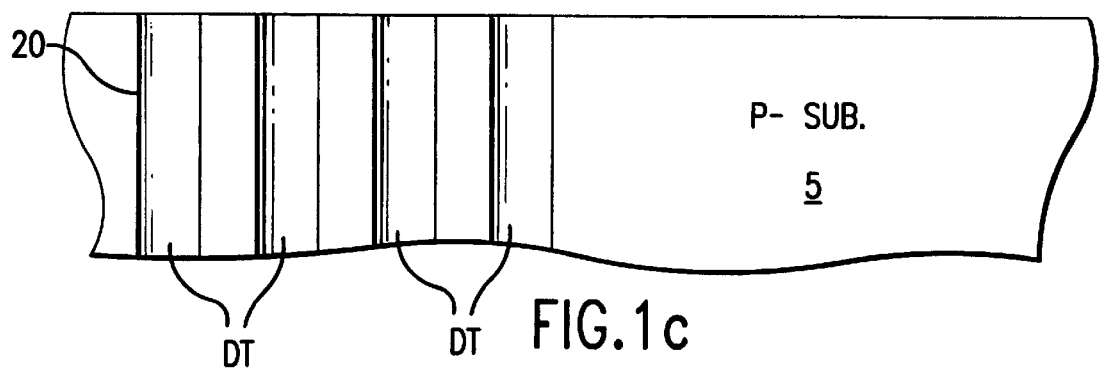
Figure 1D:
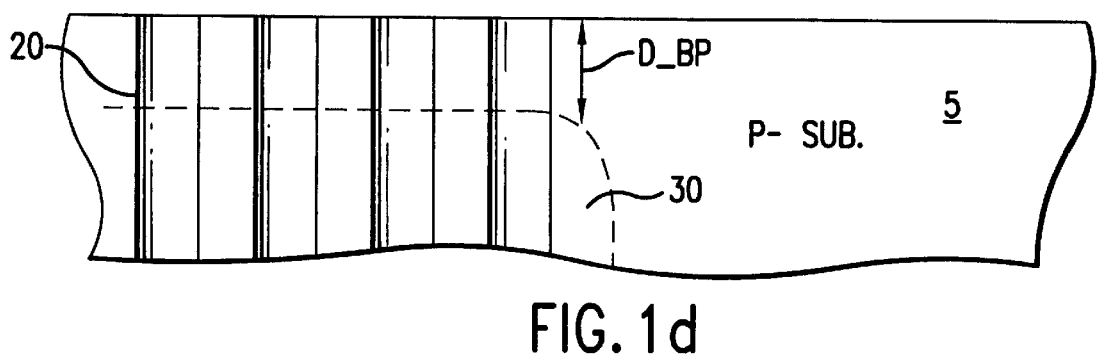
Figure 2:
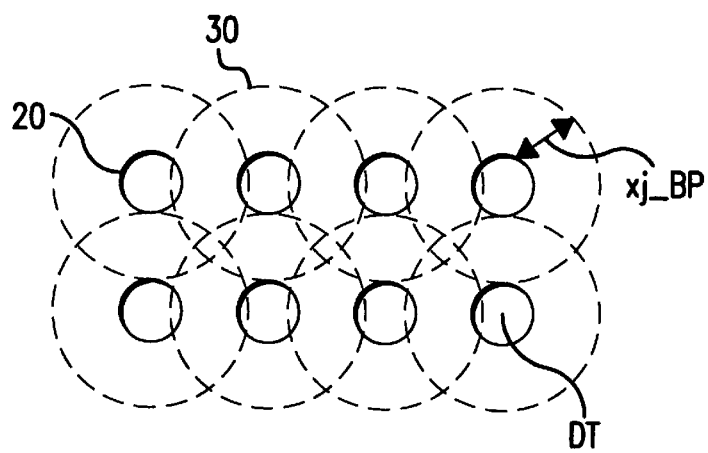
FIG. 2 is a top-down view corresponding to the process step shown in FIG. 1(d).
Figure 3:
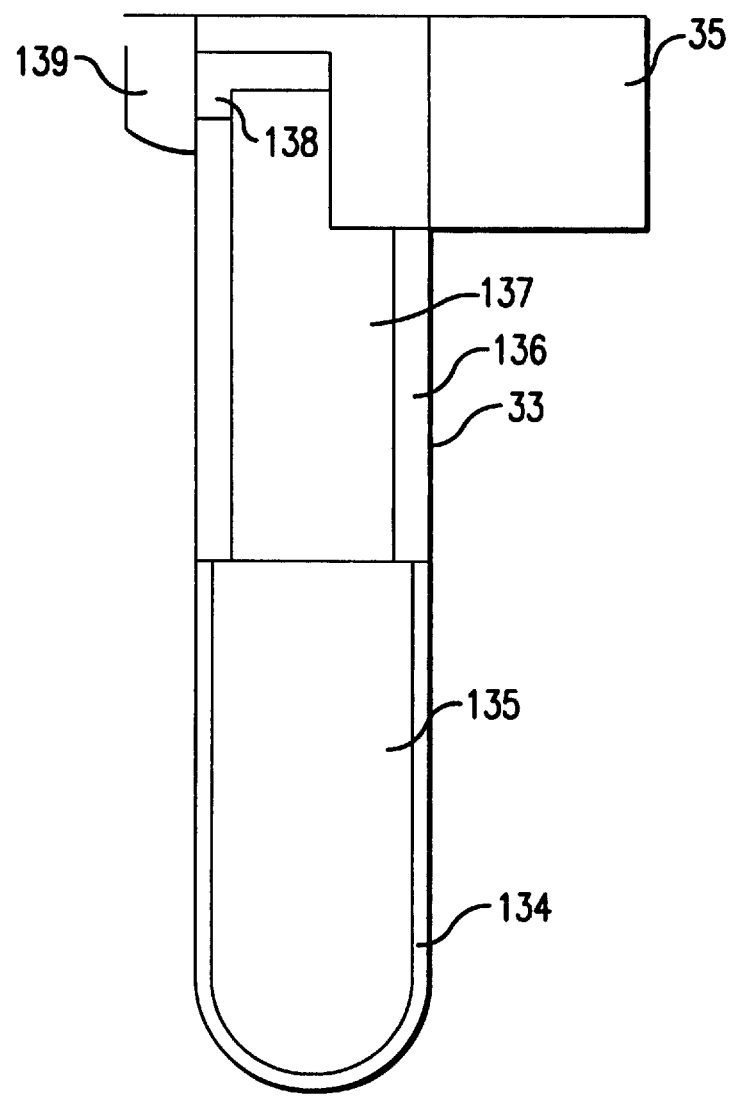
FIG. 3 illustrates a capacitor which may be utilized in the present invention.

An embodiment of the present invention will be explained with reference to FIGS. 1(a)–1(j). A shown in FIG. 1(a), a P$^-$-type semiconductor substrate 5 is provided. Then, as shown in FIG. 1(b), a photoresist 10 is formed on semiconductor substrate 5 and is patterned to form openings 15. Next, trenches 20 are formed in semiconductor substrate 5 as shown in FIG. 1(c) by an etching process such as reactive ion etching. As shown in FIG. 1(d), an N$^+$-type buried plate 30 is formed at a depth D_BP below the surface of semiconductor substrate 5 by outdiffusing impurities from trenches 20. One way in which this may be accomplished is by depositing a doped glass layer (such as an AsSG or PSG layer) on the silicon surface exposed by the trenches. The glass layer is then etched back so as to remain only at portions of trenches 20 deeper than the depth D_BP from the surface of semiconductor substrate 5. The impurities from the doped glass layer are then outdiffused into the semiconductor substrate by high temperature annealing to form N$^+$-type buried plate 30. After the buried plate 30 is formed, the remaining glass layer is removed. This method of forming buried plate 30 is for exemplary purposes only and the invention is not limited in this respect. For example, buried plate 30 may be formed by ion implantation. Ion implantation may be particularly useful where a contact will be made to a buried diffusion region which forms part of a resistor. FIG. 2 is a top-down view corresponding to the process step shown in FIG. 1(d). As is clearly shown in FIG. 2, the impurities which are outdiffused from trenches 20 should have a distribution $X_j\_BP$ such that the buried plate 30 electrically connects all of the trenches 20. Next, capacitors are formed in trenches, 20. The present invention is not limited to any particular steps for forming capacitors within trenches 25. One suitable trench capacitor arrangement is described in IEDM Technical Digest, 1993, pp. 627–630. With reference to FIG. 3, the capacitor is formed by first forming an NO (nitride/oxide) film 134 on the inner wall of trench 20. Trench 20 is then filled with a first $N^+$-type polysilicon layer 135 to form a capacitor in which NO layer 134 serves as a capacitor insulating film and the $N^+$-type polysilicon layer 135 and semiconductor substrate 5 serve as electrodes. After that, polysilicon layer 135 is etched back, and an oxide collar film 136 is formed. A second $N^+$-type polysilicon region 137 is formed by filling in the remainder of trench 20. Second $N^+$-type polysilicon layer 137 and oxide collar film 136 are then etched back and a third $N^+$-type polysilicon layer 138 is formed in the remainder of trench 20. During subsequent processing, a buried strap 139 is formed by the outdiffusing of impurities from the $N^+$-type polysilicon regions. Buried strap 139 provides an electrical connection between the capacitor and a switching transistor (not shown) of the memory cell. Numeral 35 represents a shallow trench isolation (STI) region for defining active element areas.

Figure 1E:
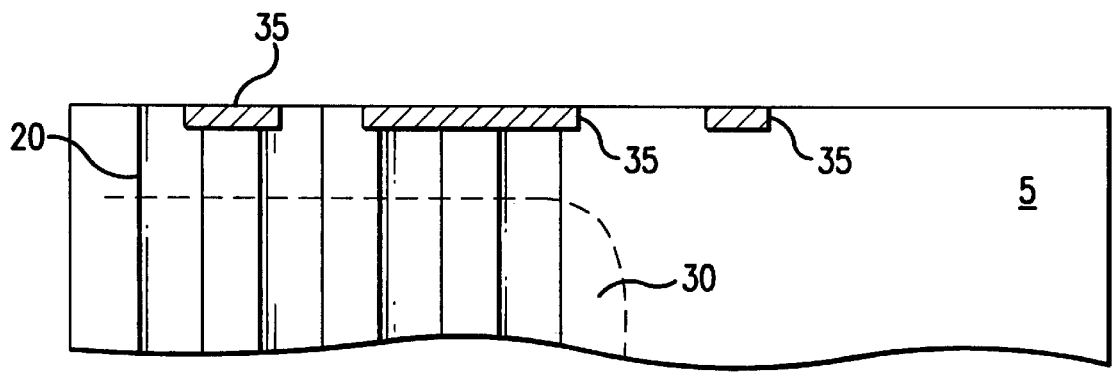
Figure 1F:
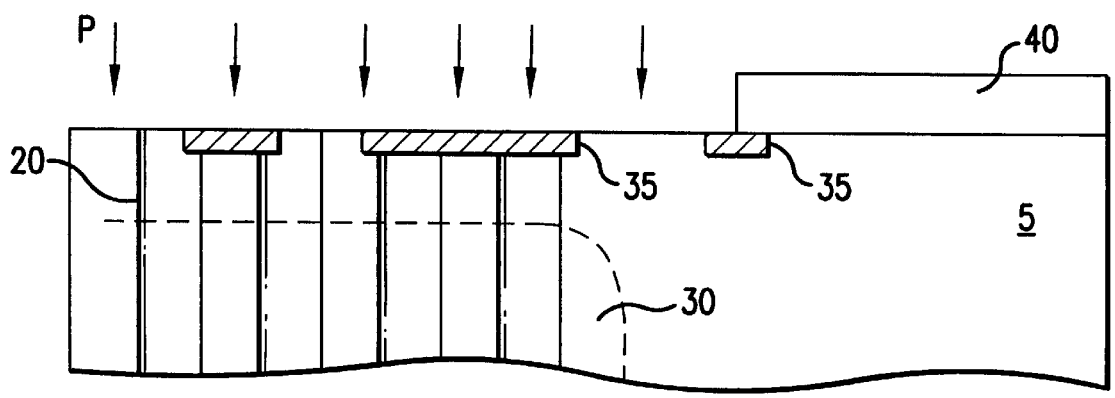
Figure 1G:
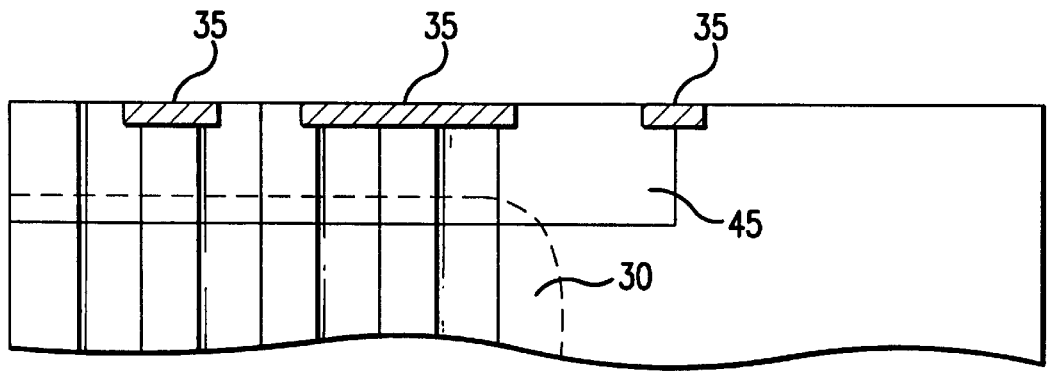
Figure 1H:
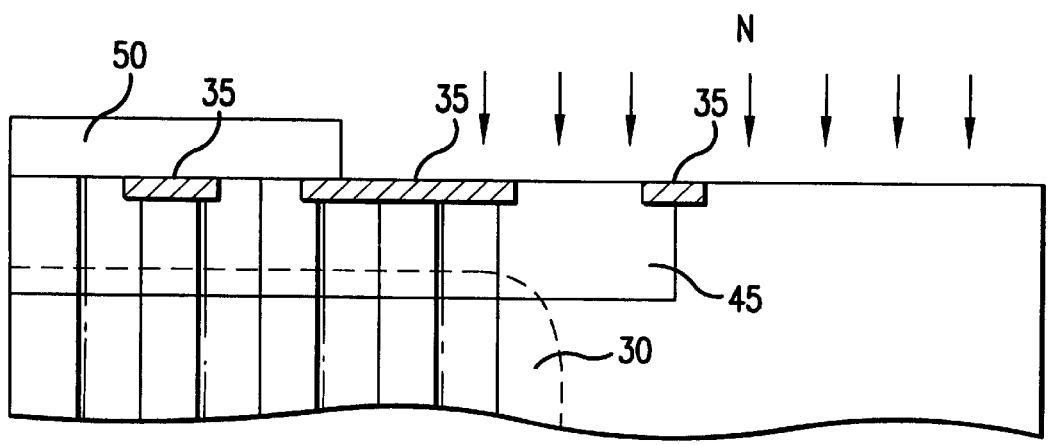
Figures 1I, 4:
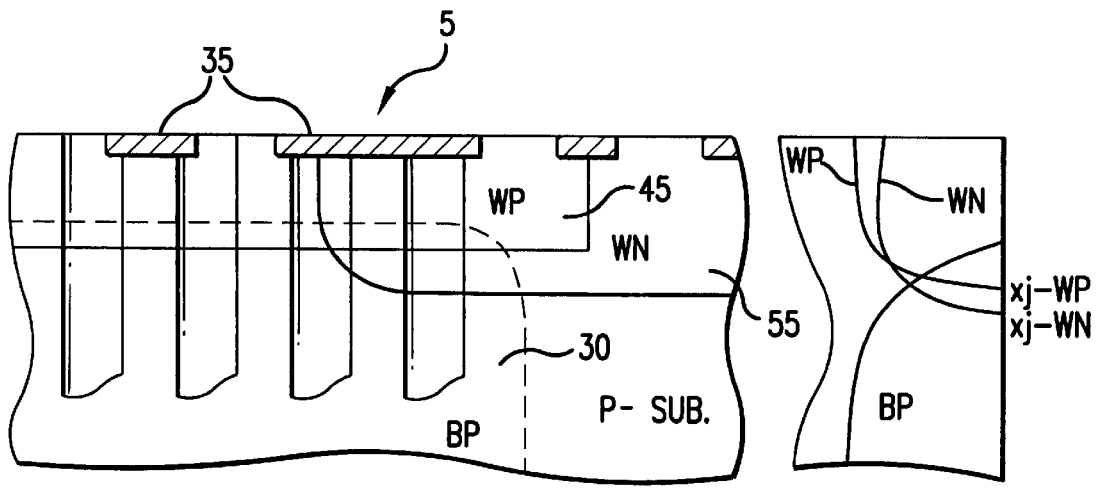
FIG. 4 is a graph of impurity concentration against depth for the well regions of the device shown in FIG. 1(I).

After the capacitor is formed in trench 20, shallow trench isolation (STI) regions 35 are formed to define active element regions on semiconductor substrate as shown in FIG. 1(e). It is noted that, for purposes of clarity, FIGS. 1(e) to 1(j) do not illustrate the capacitors formed in trenches 20. Next, as shown in FIG. 1(f), a patterned photoresist 40 is formed on the surface of semiconductor substrate 5 and P-type ions are implanted using the patterned photoresist as a mask. The P-type ion implantation process may, for example, comprise implanting $B^+$ ions with a dose of $1.5 \times 10^{13}$ cm$^{-2}$ and an implant voltage of 260 kev followed by implanting $B^+$ ions with a dose of $6 \times 10^{12}$ cm$^{-2}$ and an implant voltage of 130 kev. In this way, a P-well 45 as shown in FIG. 1(g) may be formed. Next, photoresist 40 is stripped and a patterned photoresist 50 is then formed on the surface of semiconductor substrate 5. N-type ions are then implanted using the patterned photoresist as a mask as shown in FIG. 1(h). The N-type ion implantation process may, for example, comprise implanting $P^+$ ions with a dose of $2.5 \times 10^{13}$ cm$^{-2}$ and an implant voltage of 500 kev, followed by implanting $P^+$ ions with a dose of $2 \times 10^{12}$ cm$^{-2}$ and an implant voltage of 140 kev, followed by implanting $As^+$ ions with a dose of $3 \times 10^{12}$ cm$^{-2}$ and an implant voltage of 200 kev. It is noted that the photoresist 50 is patterned such that the N-type well region will be connected to the buried plate 30 as shown in FIG. 1(i). Next, photoresist 50 is stripped.

The impurity concentrations of P-well region 45 and N-well region 55 will be discussed with reference to FIG. 4. First, it is noted that the N-well region 55 is deeper than P-well region 45, i.e., $X_j\_WN > X_j\_WP$ and N-well region 55 is connected to buried plate 30. In addition, the surface concentration of P-well region 45 is greater than the surface concentration of N-well region 55. The surface concentration of both P-well region 45 and N-well region 55 is sufficient for the fabrication of devices therein. Preferably, the surface concentrations of P-well 45 and N-well 55 are within a range of about $5 \times 10^{16}$ to about $5 \times 10^{18}$ atoms/cm$^3$. For example, the surface concentration of P-well 45 may be about $3 \times 10^{17}$ cm$^{-3}$ and the surface concentration of N-well 55 may be about $1 \times 10^{17}$ cm$^{-3}$. N-well region. 55 is a support well for forming peripheral devices used with the memory cells and, as will be described below, is ring-shaped so as to surround the P-type array well region 45. The N-well region 55 is formed to overlap with the P-type well region 45, is deeper than the P-type well region 45, and contacts the buried plate 30.

Figure 1J:
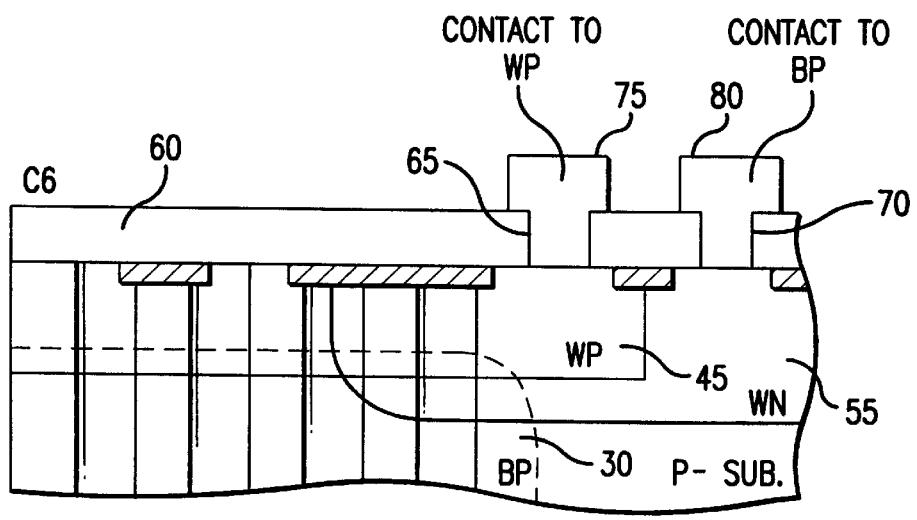

Later, as shown in FIG. 1(j), a dielectric film 60 such as a BPSG film is formed. Openings 65 and 70 are formed in dielectric film 60 using a patterned resist and reactive ion etching, for example. Contacts 75 and 80 of a metal or of polysilicon are then made to P-well region 45 and to buried plate 30, respectively.

In accordance with the method described above, a contact to the buried plate 30 for applying a potential thereto, for example, can be made using the two implant steps for forming the P-well region 45 and the N-well region 55. With reference to FIG. 1(j), there is a wide enough area at the overlapped area of the N-well region 55 and P-well region 45 to contact the P-type array well region 45 with sufficiently low resistance. In addition, there is no need for an exclusive mask for the ring-shaped well since the concentration of the array well at the overlapped area is not critical so long as it remains opposite in conductivity from the buried plate 30. This is the reason why the surface concentration of P-well region 45 is greater the surface concentration of N-well region 55 as noted above. Thus, the ring-shaped well contact for the buried plate can be formed using the mask for forming the N-type support well region 55.

Figure 5:
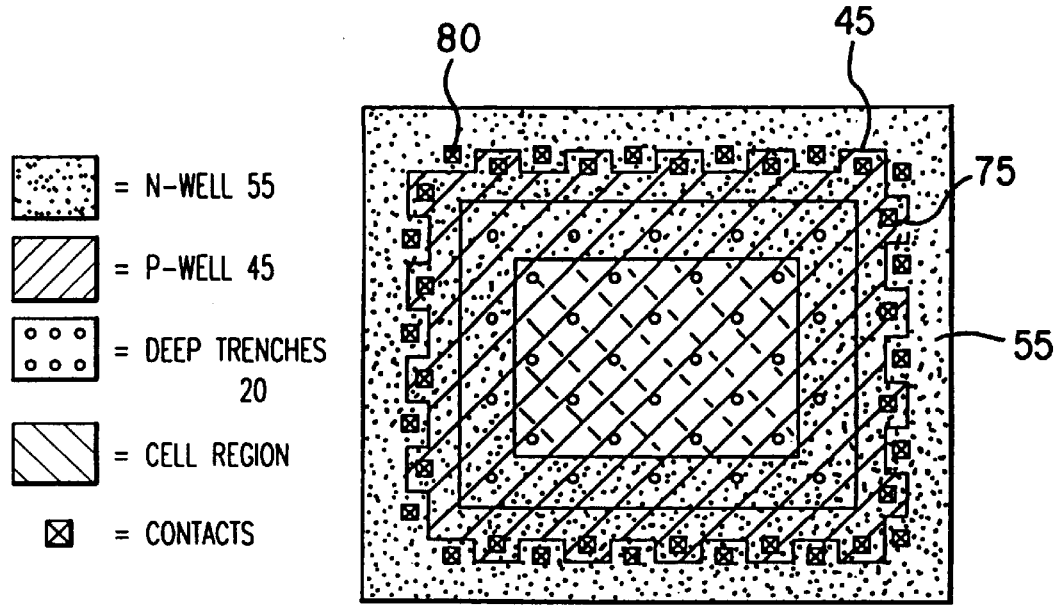
FIG. 5 is a plan view of an arrangement in accordance with the present invention.
Figure 6:
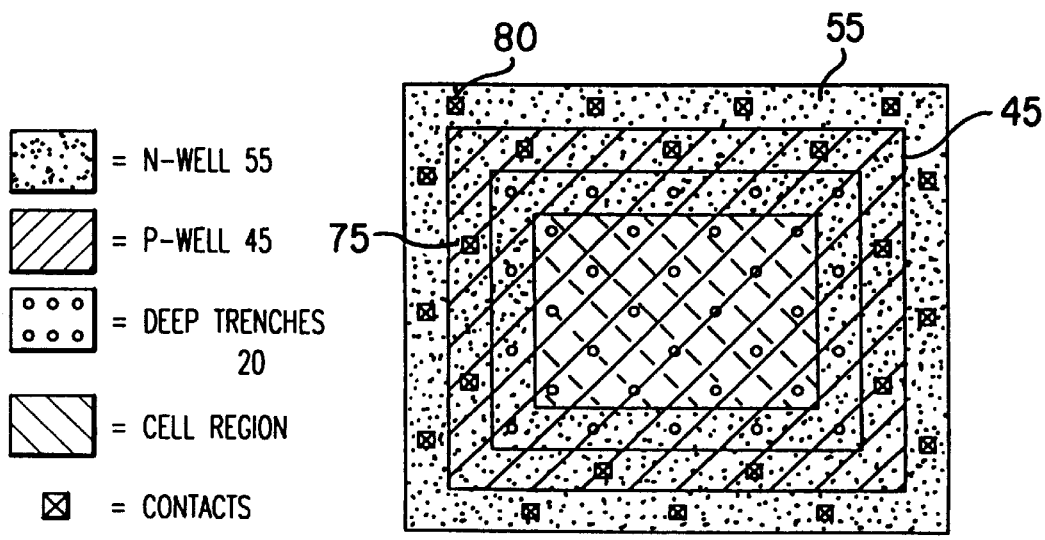
FIG. 6 is a plan view illustrating a modification of the arrangement of FIG. 5.

FIG. 5 is a plan view illustrating the arrangement of wells and trenches in accordance with the present invention. As can be seen with reference to FIG. 5, N-well 55 overlaps and surrounds P-well 45. It can also be seen with reference to FIG. 1(j) and FIG. 5 that N-well 55 contacts and surrounds buried plate 30. The contacts to the P-well 45 and the N-well 55 are arranged in substantially the same row along a given side of the arrangement shown in FIG. 5. FIG. 6 is a modification of the arrangement of FIG. 5 in which the contacts to the P-well 45 and the N-well 55 are arranged in separate rows along a given side.

Any patent documents and technical articles referred to above are incorporated herein by reference.

While the invention has been described in detail with reference to the appended drawings, the invention is limited in scope only by the following claims. Moreover, any publication cited herein should be construed to be incorporated by reference as to any subject matter deemed essential to the present disclosure.

I claim:

1. A method for forming a contact, the method comprising the steps of:

forming a plurality of trenches in a surface of a semiconductor substrate of a first conductivity type;

forming a buried impurity region of a second conductivity type in said semiconductor substrate by out diffusing impurities from said plurality of trenches, said impurities being diffused in such a way that said plurality of trenches are electrically connected to one another;

forming a first well region of the first conductivity type in said semiconductor substrate;

forming a second well region of the second conductivity type in said semiconductor substrate, said second well region overlapping said first well region and contacting and surrounding said buried impurity region, a surface impurity concentration of said first well region being greater than a surface impurity concentration of said second well region; and forming a contact to said second well region.

2. The method according to claim 1, wherein the surface impurity concentrations of said first and second well regions are in a range from about $5 \times 10^{16}$ to about $5 \times 10^{18}$ atoms/$cm^3$.

3. The method according to claim 1, wherein said plurality of trenches formed are deep trenches.

4. The method according to claim 1, wherein the step of forming a buried impurity region includes a step of forming a buried plate of the second conductivity type at a predetermined depth from said surface of said semiconductor substrate.

5. The method according to claim 4, wherein the step of forming a buried plate comprises steps of:

depositing a glass layer doped with impurities in said plurality of trenches and on said semiconductor substrate;

etching said glass layer at a predetermined depth from said surface of said semiconductor substrate in order for said glass layer to remain at deep portions of said plurality of trenches; and out diffusing the impurities of said glass layer into said semiconductor substrate by annealing.

6. The method according to claim 4, wherein the step of forming a buried plate includes a step of ion-implanting in said plurality of trenches.

7. The method according to claim 1, further comprising a step of forming a capacitor in said plurality of trenches, the step of forming a capacitor being carried out after the step of forming a buried impurity region.

8. The method according to claim 7, further comprising a step of forming a plurality of shallow trench isolation regions on said surface of said semiconductor device, the step of forming a plurality of shallow trench isolation regions being carried out after the step of forming a capacitor.

* * * * *